(12) United States Patent
Liang et al.

(10) Patent No.: US 6,275,097 B1
(45) Date of Patent: Aug. 14, 2001

(54) DIFFERENTIAL CHARGE PUMP WITH LOW VOLTAGE COMMON MODE FEEDBACK CIRCUIT

(75) Inventors: Guojin Liang, Milpitas; J. Eric Ruetz, Soquel, both of CA (US)

(73) Assignee: S3 Incorporated, Inc., Santa Clara, CA (US)

( * ) Notice: Subject to any disclaimer, the term of this patent is extended or adjusted under 35 U.S.C. 154(b) by 0 days.

(21) Appl. No.: 09/285,320

(22) Filed: Apr. 2, 1999

(51) Int. Cl.[7] .................................................. H03L 7/06
(52) U.S. Cl. ............................................ 327/536; 327/157
(58) Field of Search ........................................ 327/157, 536, 327/538, 539, 148; 331/1 A, 17

(56) References Cited

U.S. PATENT DOCUMENTS

| | | | |
|---|---|---|---|
| 4,577,121 | 3/1986 | Sano et al. | 307/355 |
| 4,847,519 | 7/1989 | Wahl et al. | 307/296.2 |
| 5,029,282 | 7/1991 | Ito | 307/296.8 |
| 5,168,174 | 12/1992 | Naso et al. | 307/296.6 |
| 5,321,370 | 6/1994 | Yukawa | 330/258 |
| 5,416,691 | 5/1995 | Croughwell | 363/60 |
| 5,422,529 | 6/1995 | Lee | 327/536 |
| 5,422,600 | 6/1995 | Petty et al. | 330/257 |
| 5,491,439 | 2/1996 | Kelkar et al. | 327/157 |
| 5,495,207 | 2/1996 | Novof | 331/57 |
| 5,513,225 | 4/1996 | Kelkar et al. | 375/376 |
| 5,525,932 | 6/1996 | Kelkar et al. | 331/1 A |
| 5,534,821 | 7/1996 | Akiyama et al. | 331/8 |
| 5,539,381 | 7/1996 | Johnson | 340/584 |
| 5,546,052 | 8/1996 | Austin et al. | 331/1 A |
| 5,619,161 | 4/1997 | Novof et al. | 327/535 |
| 5,629,641 | 5/1997 | Cheng | 327/108 |
| 5,663,689 | 9/1997 | Baumgartner et al. | 331/17 |
| 5,694,072 | 12/1997 | Hsiao et al. | 327/537 |
| 5,703,511 | 12/1997 | Okamoto | 327/157 |
| 5,734,279 | 3/1998 | Bereza | 327/112 |
| 5,736,880 | 4/1998 | Bruccoleri et al. | 327/157 |
| 5,736,892 | 4/1998 | Lee | 327/536 |
| 5,740,213 | 4/1998 | Dreyer | 375/374 |
| 5,936,445 | * 8/1999 | Babanezhad et al. | 327/157 |

* cited by examiner

*Primary Examiner*—Dinh T. Le
(74) *Attorney, Agent, or Firm*—Christie, Parker & Hale, LLP

(57) ABSTRACT

A differential charge pump utilizing a common mode feedback circuit. The charge pump includes a dual reference current source and outputs a differential current signal by modifying currents routed to the outputs utilizing current paths having transistors maintained in the linear region within the current paths. The common mode feedback circuit includes differential transistors requiring a maximum power supply voltage of a common mode reference voltage plus a transistor threshold voltage.

16 Claims, 5 Drawing Sheets

DIFFERENTIAL CHARGE PUMP WITH LOW VOLTAGE COMMON MODE FEEDBACK CIRCUIT

BACKGROUND OF THE INVENTION

This invention relates generally to charge pumps for phase locked loops, and more specifically to a differential input and output charge pump and an associated common mode feedback circuit.

Phase locked loops (PLLs) maintain an output signal in phase relationship to an input signal. Accordingly, PLLs are useful for deriving a clock signal from an incoming digital data stream. Modern digital data communication systems operate at extremely high frequencies at which data bandwidth is at a premium. Providing a clock signal, along with a data signal, inordinately taxes the bandwidth of such systems. Thus, PLLs are used, often as part of a clock recovery unit, to derive a clock signal from incoming data signals.

PLLs generally comprise a phase comparator providing an up signal and a down signal, a charge pump receiving the up signal and down signal, a low pass filter receiving the output of the charge pump, and a voltage or current controlled oscillator. The phase comparator determines if the frequency of the oscillator needs to be increased or decreased. The phase comparator outputs the up signal when the frequency of the oscillator needs to be increased, and outputs the down signal when the frequency of the oscillator needs to be decreased.

The high frequency at which data is communicated in modern data systems, and the need for higher reliability for the transmission of such data, however, places significant requirements and low margins of error on PLLs. One source of errors in PLLs is the charge pump circuitry.

Charge pumps are often comprised of CMOS transistor elements. The CMOS transistor elements often exhibit slight variations in performance due to mechanical manufacturing discrepancies. Such discrepancies often result in variations in the handling of the up and down input signals. Additionally, variations in the power supply used to power or bias the transistor elements also may result in unnecessary variations, or jitter, in the charge pump signal.

One way to improve the performance of a charge pump is to use differential inputs or outputs, as well as to use a feedback circuit based on a common mode signal of the differential outputs. Charge pumps with a differential output utilizing a common mode circuit to reduce fluctuations in the differential outputs are known. Advances in semiconductor device design and manufacturing, however, has resulted in circuitry using decreased voltage levels. Such decreased voltage levels make the use of current sources inside a common mode feedback circuit difficult.

SUMMARY OF THE INVENTION

The present invention therefore provides a differential charge pump for a low jitter PLL and a low voltage common mode feedback circuit. The charge pump includes a first signal source responsive to a reference signal and a common mode feedback signal, with the first signal source providing a first signal. A first output signal path is coupled to the first signal source, with the first output signal path providing a path for a first output signal. The first output signal comprises at least a portion of the first signal. The charge pump also includes a first switched signal path coupled with the first signal source. The first switched signal path includes an up signal controlled switch having active and nonactive states, with the state of the up signal controlled switch controlled by an up signal. The first switched signal path provides a path for a first switched signal, the first switched signal being at least a portion of the first signal. The charge pump also includes a second signal source responsive to the reference signal and the common mode feedback signal, with the second signal source providing a second signal. A second output signal path is coupled to the second signal source, with the second output signal path providing a path for a second output signal. The second output signal comprises at least a portion of the second signal. The charge pump also includes a second switched signal path coupled with a second signal source. The second switched signal path includes a down signal controlled switch having active and nonactive states, with the state of the down signal controlled switch controlled by a down signal. The second switched signal path provides a path for a second switched signal, the second switched signal being at least a portion of the second signal. In addition, a common mode circuit is coupled to the first output signal path and the second output signal path. The common mode circuit generates the common mode feedback signal based on a common mode component of the first and second output signals.

In one embodiment the common mode feedback circuit comprises an input differential transistor pair receiving a differential input. The differential transistor pair produces a common mode current. A reference current source, on the other hand, provides a reference current. Coupled to the input differential transistor pair and the reference current source is a current mirror. The current mirror has a first current provided by the reference current, and a second current provided by the common mode current. The current mirror is controlled by the reference current. The common mode feedback circuit additionally comprises a difference wire. The difference wire provides a path for excess current when the differential transistor pair produces a current and magnitude greater than a second current, the second current being the current controlled by the current mirror to be equaled magnitude for the reference current.

Many of the attendant features of this invention will be more readily appreciated as the same becomes better understood by reference to the following detailed description considered in connection with the accompanying drawings.

DETAILED DESCRIPTION

Figure 1:
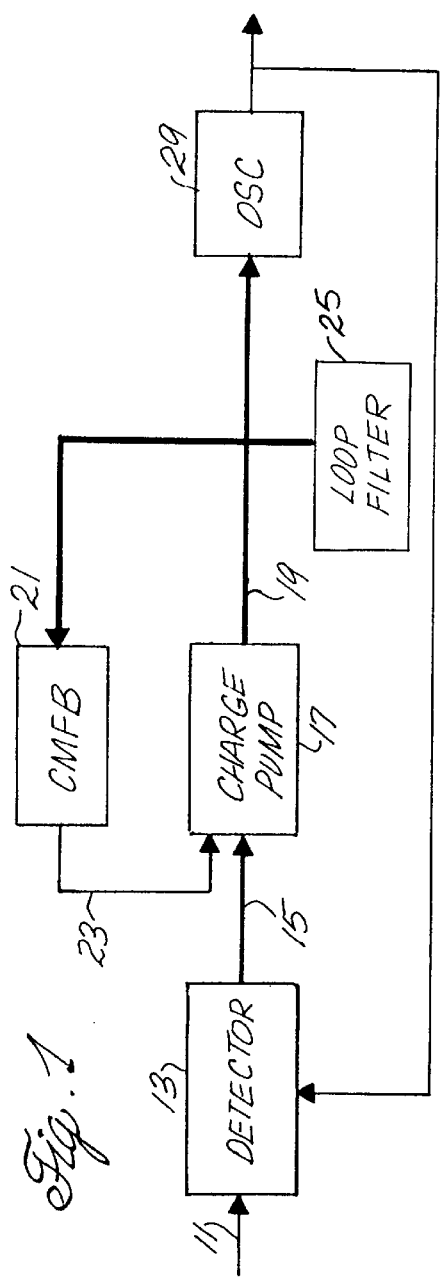
FIG. 1 illustrates a block diagram of a PLL utilizing a charge pump and common mode feedback circuit of the present invention.

FIG. 1 illustrates a block diagram of a PLL utilizing the present invention. A detector 13 receives an input data signal 11. The input data signal 11 is a signal containing digital data at a frequency fixed by a transmitting device. The detector examines the received signal and determines when a rising edge or a falling edge of the received signal occurs. Methods for determining the receipt of a rising edge or a falling edge of a received signal are well known in the art. As illustrated, the detector has four outputs, a differential up signal, namely an up (UP) signal and its complement, an UB signal, and a differential down signal, namely a down (DN) signal and its complement, a DB signal, all of which are commonly indicated at 15. The UP signal goes high on receipt of a rising edge pulse of the data signal. The DN signal goes high on receipt of a falling edge of the received data signal. The complementary signals UB and DB are the inverse of the UP signal and the DN signal, respectively.

The UP, DN, UB and DB signals are provided to a charge pump 17. The charge pump uses the UP, DN, UB and DB signals in forming a differential charge pump signal 19. The differential charge pump signal is filtered by a filter 25, and provided to an oscillator 29. The oscillator, as illustrated, is a current controlled oscillator (CCO), although a voltage controlled oscillator (VCO) may be used if a current to voltage converter is additionally used in the PLL.

The differential output of the charge pump is also provided to a common mode feedback circuit 21. The common mode feedback circuit 21 determines the common mode voltage of the differential output, and compares that common mode voltage to a reference voltage. The difference between the common mode voltage and the reference voltage is output from the common mode feedback circuit as a common mode feedback signal 23. The common mode feedback signal is provided to the charge pump, and allows the charge pump to modify the charge pump differential output signal.

Figure 2:
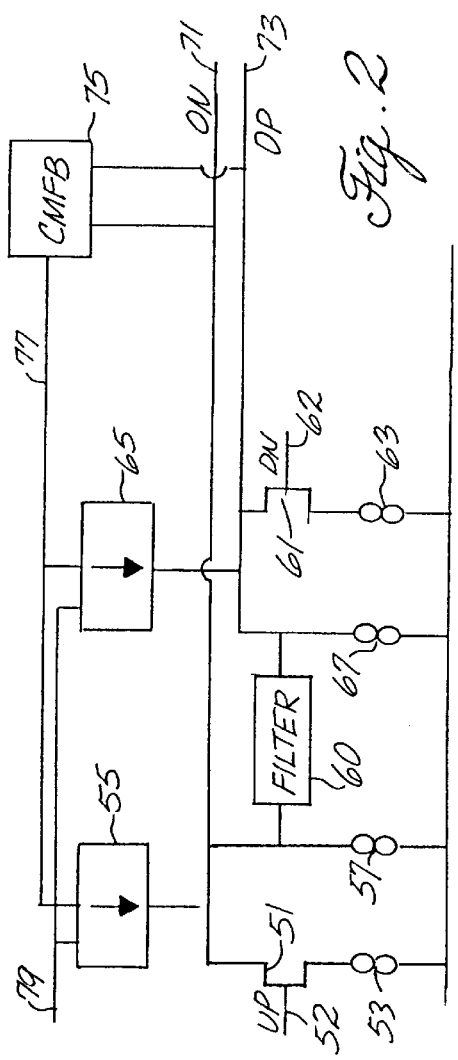
FIG. 2 is a semi-schematic semi-block diagram of one embodiment of the charge pump of the present invention.

FIG. 2 is a illustration of a semi-schematic semi-block diagram of a differential output charge pump. Use of the charge pump of FIG. 2 in the system of FIG. 1 may be accomplished by ignoring the UB and DB signals. In the charge pump of FIG. 2 an NMOS transistor 51 receives an UP signal 52 at the gate of the transistor 51. The source of the transistor is connected to a driving transistor 53. The drain of the transistor 51 is connected to the output of an up current source 55, which develops a first current, $I_{55}$. Also connected to the up current source 55 is the drain of a second up driving transistor 57. An ON wire is additionally connected to the output of the up current source.

Similarly, a down NMOS transistor 61 has a DN signal 62 coupled to its gate. The source of the down transistor 61 is connected to a down driving transistor 63. The drain of the down transistor 61 is connected to a down current source 65 which develops a second current, $I_{65}$. Also connected to the current source 65 is a second down driving transistor 67. An OP wire is additionally connected to the output of the down current source.

A filter 60 is coupled to the ON wire and the OP wire. The filter is used to control the dynamics of a phase locked loop of which the charge pump is a component. Such filters, and the construction thereof, are well known in the art.

The first current flows through the up driving transistor, second up driving transistor, and the ON wire when the UP signal is high. When the UP signal is low the first current flows through the second up driving transistor and the ON wire. Accordingly, when the UP signal is high the ON wire current, $I_{ON}$, is the up driving transistor current, $I_{55}$, minus the second up driving transistor current, $I_{57}$, and minus the first up driving transistor current, $I_{53}$. When the UP signal is low, no current flows through up driving transistor 53 and the ON wire current is $I_{55}$ minus $I_{57}$.

The second current flows through the down driving transistor, the second down driving transistor, and the OP wire when the DN signal is high. When the DN signal is low the second current flows through the second down driving transistor and the OP wire. When the DN signal is high the OP wire current, $I_{OP}$, is the driving transistor current, $I_{65}$, minus the second down driving transistor current, $I_{67}$, and minus the down driving transistor current, $I_{63}$. When the up signal is low, no current flows through the down driving transistor 63 and the OP wire current is $I_{65}$ minus $I_{67}$.

The ON and OP wires form the differential outputs of the charge pump. Therefore, when the charge pump receives a high UP signal and a low DN signal, the currents $I_{on}$ and $I_{op}$ are determined by $I_{on}=I_{55}-I_{57}-I_{53}$
$I_{op}=I_{65}-I_{67}$.

When the charge pump receives a low UP signal and a high DN signal the currents $I_{on}$ and $I_{op}$ are determined by $I_{on}=I_{55}-I_{57}$
$I_{op}=I_{65}-I_{67}-I_{63}$.

Thus, assuming that transistors 53 and 63 and transistors 57 and 67 are matched, $I_{on}$ minus $I_{op}$ is equal to $-I_{53}$ when UP is high and DN is low, and $I_{on}$ minus $I_{op}$ is equal, due to transistor matching, to $I_{53}$ when UP is low and DN is high.

The ON signal and the OP signal are additionally coupled to a common mode feedback circuit 75. The common mode feedback circuit determines the common mode voltage of the ON and OP signals and compares the common mode voltage to a reference. So long as the transistors are properly biased and the current source outputs are controlled to generate currents which maintain operation of the transistors in the linear region where the drain to source voltage is proportional to the drain to source current, the voltages of the ON and OP signals are determined by the currents flowing in the driving and switching transistors. Therefore, the common mode voltage of the OP and ON wires is proportional to their currents, and the common mode voltage may be inspected as part of a control of the currents in the ON and OP wires. Based on the results of the comparison of the common mode voltage to the reference, the common mode feedback circuit outputs a corrective signal, a common mode feedback signal 77, to the current sources 55 and 65.

The current sources 55 and 65 additionally receive a reference signal 79. The current sources 55 and 65 utilize both the reference signal and the common mode feedback signal 77 in determining the amount of current to source. Utilization of the common mode feedback signal in addition to the reference signal allows the transistors to be maintained in the linear region, and additionally minimizes the effect of any jitter in the power supply signal.

Figure 3:
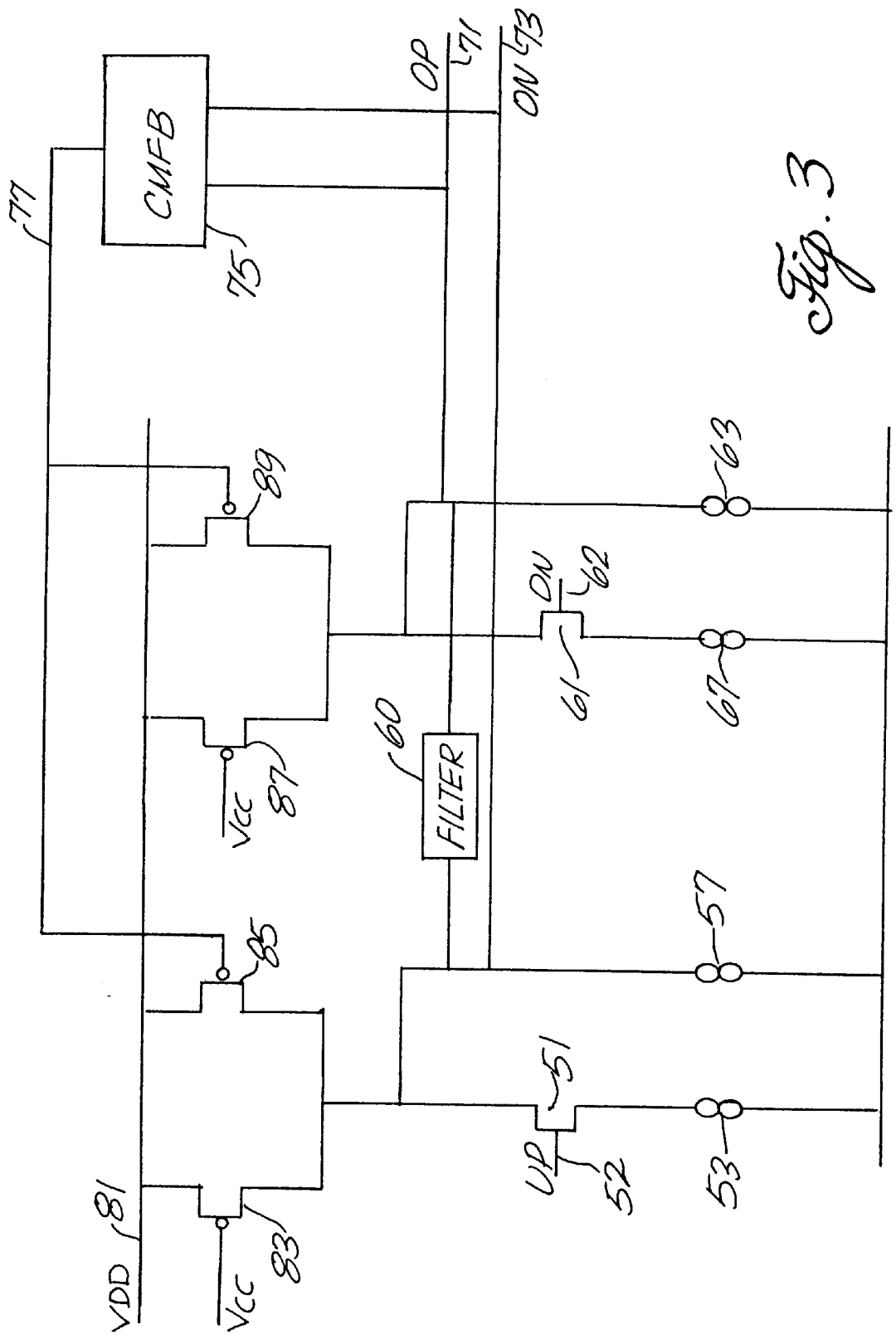
FIG. 3 is a semi-schematic semi-block diagram of the charge pump of FIG. 2 illustrating a dual control current source.

FIG. 3 illustrates a semi-schematic semi-block diagram of a dual current source charge pump with common mode feedback circuit of the present invention. The dual current charge pump of FIG. 3 is similar to the charge pump of FIG. 2, and the common elements are similarly numbered. The charge pumps of FIGS. 2 and 3 differ, however, in that the current provided to transistors 51 and 61 are derived from the sources of transistors 83 and 85, and 87 and 89, respectively. The gates of transistors 85 and 89 are coupled to the common mode feedback signal 77, and the gates of transistors 83 and 87 are coupled to a reference voltage $V_{CC}$. The drains of transistors 83, 85, 87, and 89 are coupled to a power supply voltage $V_{DD}$ 81. Accordingly, the currents passing through transistors 51 and 61 are modified, but to an extent only, by the common mode feedback circuit. The use of dual current sources, therefore, ameliorates swings in the output of the charge pump, by keeping the transistors 51 and 61 operating in the linear range, without providing overcompensation. In addition, the use of dual current sources helps minimize the effect of power supply noise on circuit operation.

In the embodiment described, the transistors 83 and 87 are matched, with a width to length ratio of 8. The transistors 85 and 89 are also matched, but have a width to length ratio of 6.66. The mismatch in width to length ratios, with the transistors 83 and 87 having a slightly greater width to length ratio, further minimizes system overcompensation.

Figure 4:
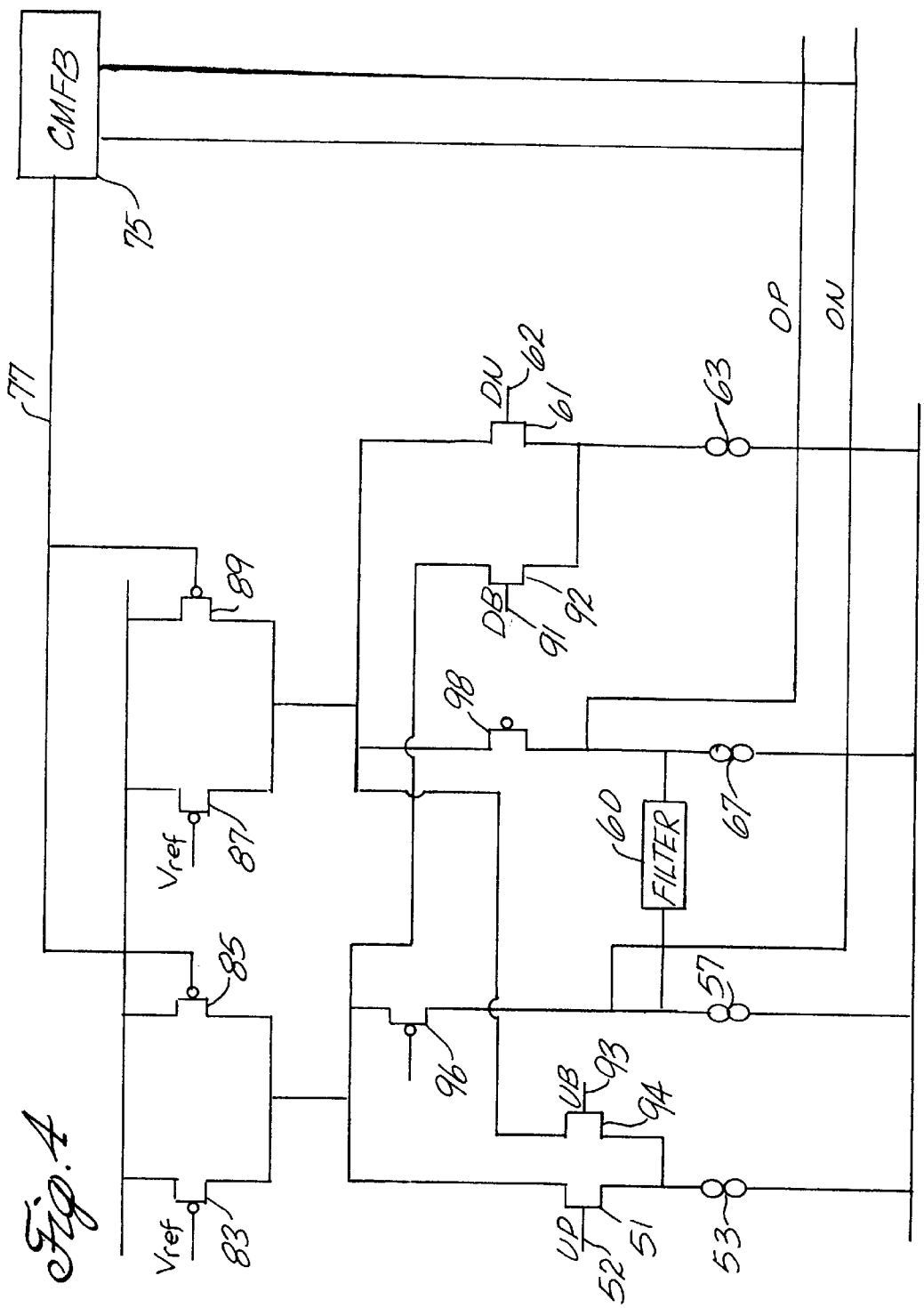
FIG. 4 is a semi-schematic semi-block diagram of a differential input and differential output charge pump of the present invention.

FIG. 4 illustrates a semi-schematic semi-block diagram of a differential input dual current source charge pump with common mode feedback circuit of the present invention. The charge pump of FIG. 4 is similar to the charge pump of FIGS. 2 and 3, and the common elements are similarly numbered. The charge pump of FIG. 4 additionally includes a differential input, that is the charge pump is provided a UB signal 93 and a DB signal 91. The UB signal and the DB signal are the complements of the UP signal and the DN signal, respectively. The UB signal is provided to a gate of a transistor 94. The drain of the transistor 94 is connected to the sources of transistors 87 and 89, which are also connected to the drain of the transistor 61 whose gate is connected to the down signal. The source of the transistor 94 is connected to the drain of the driving transistor 53, to which the source of the transistor 51, whose gate the UP signal is connected, is also attached. Likewise, the DB signal is connected to the gate of a transistor 92. The source of the transistor 92 is connected to the drain of the charging transistor 67 and the drain of the transistor 92 is connected to the sources of transistors 83 and 85. The transistor 51, whose gate is connected to the UP signal, also has its drain connected to the sources of transistors 83 and 85.

The OP and ON signals are developed from the sources of transistors 96 and 98, respectively. Accordingly, when the UP signal is high and the DN signal is low, which also means the DB signal is high and the UB signal is low, the current generated by transistors 83 and 85, denoted as $I_u$, flows through driving transistor 53, driving transistor 57, driving transistor 63 and the ON wire. The current generated by transistors 87 and 89, denoted as $I_d$, however, only flows through driving transistor 63 and the OP wire. Conversely, when the DN signal is high and the UP signal low, and therefore the UB signal high and the DB signal low, the current generated by transistors 83 and 85 only flows through transistor 57 and the ON wire. The current generated by transistors 87 and 89, on the other hand, flows through transistor 53, transistor 63, transistor 67, and the OP wire.

Thus, when the UP signal is high and the DN signal is low the current in the OP wire, $I_{op}$, and the current in the ON wire, $I_{on}$, are $I_{op} = I_u - I_{53} - I_{57} - I_{63}$ $I_{on} = I_d - I_{67}$ Transistors 57 and 67, and transistors 53 and 63, are matched. Therefore $I_{53}$ equals $I_{63}$, and $I_{57}$ equals $I_{67}$, and, denoting $I_{53}$ as $I_O$, $I_{OP} - I_{ON} = 2I_0$.

Conversely, when the DN signal is high and the UP signal is low the currents $I_{op}$ and $I_{on}$ are $I_{op} = I_u - I_{57}$ $I_{on} = I_d - I_{53} - I_{63} - I_{67}$ and $I_{op} - I_{on} = 2I_0$.

Figure 5:
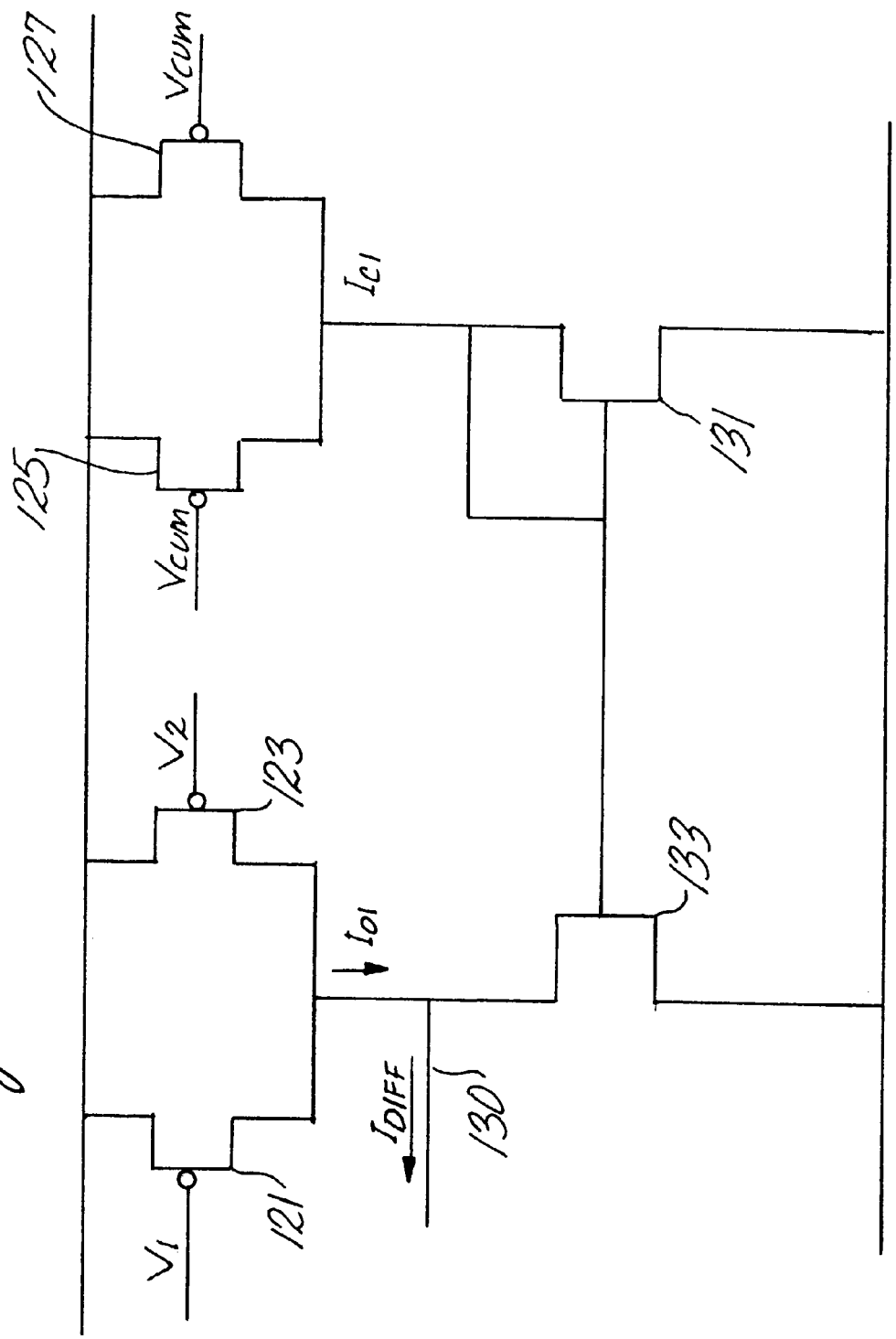
FIG. 5 is a semi-schematic semi-block diagram of a common mode feedback circuit of the present invention.

FIG. 5 illustrates a semi-schematic diagram of a differential input common mode feed back circuit of the present invention. A differential pair is comprised of transistors 121 and 123. The gate of the transistor 121 is coupled to the ON wire. The gate of the transistor 123 is coupled to the OP wire. As previously stated, the charge pump circuitry transistors are maintained in the linear region, and therefore the voltages at the gates of the transistors 121 and 123 are proportional to the currents in the ON and OP wires. The drains of both transistors 121 and 123 are connected to a reference voltage.

The transistors 121 and 123 produce a differential output current $I_{D1}$ at the connection between the sources of the transistors 121 and 123. The differential output current $I_{D1}$ is equal to the drain-to-source current through the transistor 121 plus the drain-to-source current through the transistor 123. As the transistors 121 and 123 are maintained in the linear region the drain-to-source current through the transistor 121 is proportional to the input voltage V1. Likewise the drain-to-source current through the transistor 123 is proportional to the input voltage V2. Thus, the differential output current $I_{D1}$ is proportional to the input voltage V1 plus the input voltage V2.

Transistors 125 and 127 similarly form a reference differential pair. The gates of transistors 125 and 127 are provided a common mode reference voltage $V_{COM}$. A common mode reference current $I_{C1}$ is generated by the transistors 125 and 127 at the connection between source terminals of the transistors 125 and 127. As the transistors 125 and 127 are maintained in the linear region. The common mode reference current $I_{C1}$ is proportional to twice the common mode voltage $V_{COM}$.

The connection between the sources of transistors 121 and 123 forming the differential pair are connected to the drain of a transistor 131. The connection between the sources of transistors 125 and 127 are connected to the drain of a transistor 133, as well as to the gates of both transistor 131 and transistor 133. Accordingly, the transistors 131 and 133 form a current mirror, and a current equal in magnitude to the current $I_{C1}$ flows through both transistors 131 and 133.

If the magnitude of the current $I_{C1}$ produced by the reference differential pair is less than the magnitude of the current $I_{D1}$ produced by the differential pair, then a current $I_{Diff}$ is shunted out on the difference wire 130. If the magnitude of $I_{C1}$ is greater than the magnitude of $I_{D1}$, however, then a current $I_{Diff}$ is provided to the current mirror by the difference wire. Therefore, with the differential output current $I_{D1}$ being directly proportional to the input voltages V1 and V2 and the common output current $I_{C1}$ being directly proportional to twice the common mode voltage $V_{COM}$, the difference current $I_{Diff}$ will be directly proportional to the difference between the input voltages V1 and V2 and the common mode voltage $V_{COM}$.

Further, in the above described embodiment, the reference differential pair is active in the linear region when the drain of the transistors 125 and 127 are maintained at a voltage above the threshold voltage, $V_t$, for the device. As the gates of transistors 125 and 127 receive a voltage of $V_{com}$ the drains must be maintained at least at a voltage equal to $V_t + V_{com}$. Similarly, the drains of the differential transistors 121 and 123 must be maintained at least at a voltage $V_t$ plus the greater of voltages $V_1$ or $V_2$. As $V_1$ and $V_2$ do not greatly exceed $V_{com}$, the power supply voltage need be only slightly greater than $V_{com} + V_t$.

Figure 6:
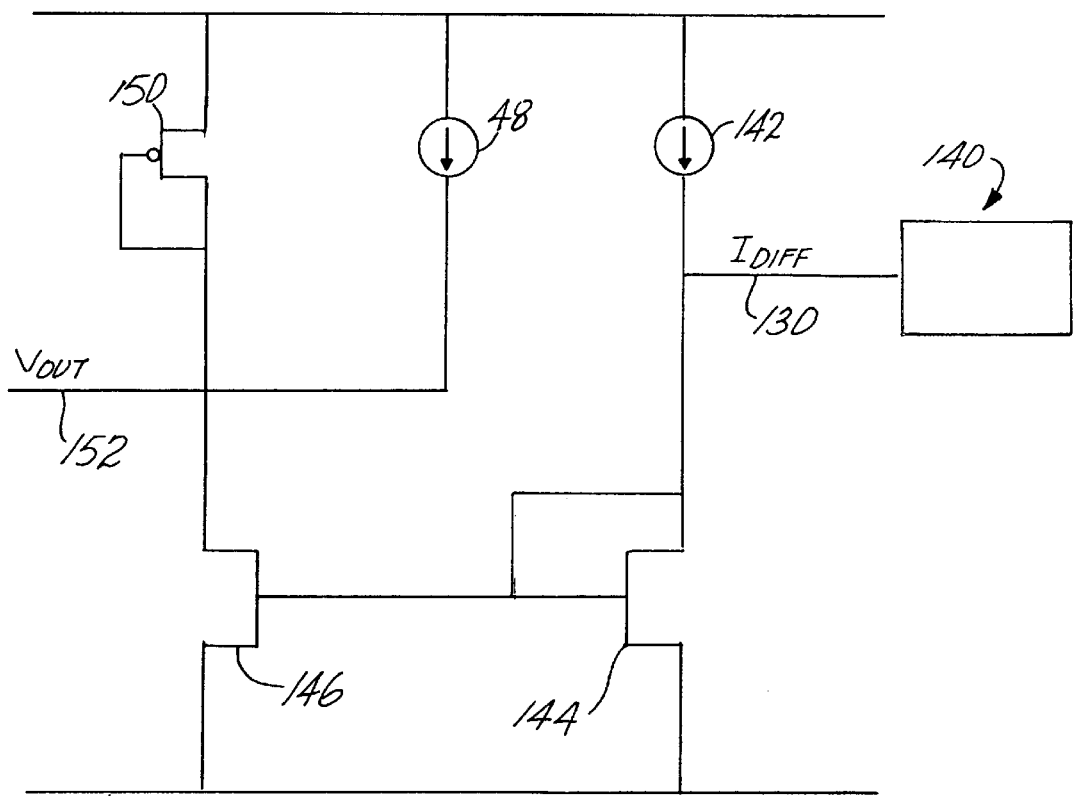
FIG. 6 is a semi-schematic semi-block diagram of another common mode feedback circuit of the present invention.

FIG. 6 illustrates a further semi-schematic diagram of a common mode feed back circuit of the present invention. Differential circuitry 140 generates a current $I_{diff}$ on wire 130, with the current $I_{diff}$ proportional to the common mode voltage of the differential output of a charge pump. The wire 130 is connected, along with the output of a current source, to the drain and gate of a transistor 144, as well as the gate of a transistor 146. The transistors 144 and 146 therefore form a current mirror, with the magnitude of the current flowing through the transistor 146 equal to the current generated by the current source plus the current $I_{Diff}$.

The current flowing through the transistor 146 is generated by a current source 148 and a PMOS transistor 150 in a diode configuration, namely with the drain of the PMOS coupled to the gate transistor. The current source 148 is matched to the current source 142, and produces the same amount of current as the current source 142. The current passing through the PMOS transistor 150 therefore must be equal in magnitude to $I_{Diff}$. Thus, a voltage is developed at a terminal 152 coupled to the drain of the PMOS transistor 150 and the drain of the transistor 146. The voltage is proportional to the current $I_{Diff}$, and which is proportional to the difference between the common mode voltage and the reference voltage, and therefore may be used as the common mode feedback signal. This voltage may be conveniently used as a source of a common mode feedback signal, and provides the common mode feedback signal 77 of FIGS. 2–4.

In addition, in one embodiment the transistor 146 is replaced with multiple transistors, all with drains connected to the terminal 152 and gates coupled to the wire 130. The use of multiple transistors increases the current flowing through the PMOS transistor 150. Therefore a signal on terminal 152 is amplified with respect to a signal on wire 130, and system responsivity thereby enhanced.

Accordingly, the present invention provides a charge pump and a common mode feedback circuit. Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. A charge pump including a common mode feedback circuit comprising:

a first signal source comprised of first two current sources, the current generated by a first of the first two current sources being proportional to a reference signal and the current generated by a second of the two current sources being proportional to a common mode feedback signal, the first signal source providing a first output signal at a first output terminal;

a first switch coupled to said first output terminal, the first switch being an up signal controlled switch having active and non-active states, the state of the up signal controlled switch being controlled by an up signal;

a second signal source comprised of second two current sources, the current generated by a first of the second two current sources being proportional to the reference signal and the current generated by a second of the two current sources being proportional to the common mode feedback signal, the second signal source providing a second output signal at a second output terminal;

a second switch coupled to said second output terminal, the second switch being a down signal controlled switch having active and non-active states, the state of the down signal controlled switch being controlled by a down signal; and a common mode circuit receiving the first signal and the second signal, the common mode circuit generating the common mode feedback signal based on a common mode component of the first and second signals.

2. The charge pump including a common mode feedback circuit of claim 1 wherein the up signal controlled switch is a first field effect transistor whose gate receives the up signal, and the down signal controlled switch is a second field effect transistor whose gate receives the down signal.

3. The charge pump including a common mode feedback circuit of claim 2 wherein the first of the first two current sources of the first signal source is comprised of a field effect transistor whose gate receives said reference signal and the second of the first two current sources is comprised of a field effect transistor whose gate receives the common mode feedback signal.

4. A charge pump including a common mode feedback circuit comprising:

a first signal source responsive to a reference signal and a common mode feedback signal, the first signal source providing a first signal;

a first output signal path coupled to the first signal source, the first output signal path providing a path for a first output signal, the first output signal being at least a portion of the first signal;

a first switched signal path coupled to the first signal source, the first switched signal path including an up signal controlled switch having active and non-active states, the state of the up signal controlled switch being controlled by an up signal, with the first switched signal path providing a path for a first switched signal, the first switched signal being at least a portion of the first signal, when the up signal controlled switch is in the active state;

a second signal source responsive to the reference signal and the common mode feedback signal, the second signal source providing a second signal;

a second output signal path coupled to the second signal source, the second output signal path providing a path for a second output signal, the second output signal being at least a portion of the second signal;

a second switched signal path coupled to the second signal source, the second switched signal path including an down signal controlled switch having active and non-active states, the state of the down signal controlled switch being controlled by an down signal, with the second switched signal path providing a path for a second switched signal, the second switched signal being at least a portion of the second signal, when the down signal controlled switch is in the active state; and a common mode circuit coupled to the first output signal path and the second output signal path, the common mode circuit generating the common mode feedback signal based on a common mode component of the first and second output signals;

wherein the first signal source is a current source, the first signal is a first current, the second signal source is a current source, and the second signal is a second current;

wherein the up signal controlled switch is a first field effect transistor whose gate receives the up signal, and the down signal controlled switch is a second field effect transistor whose gate receives the down signal;

wherein the first current source is comprised of a first reference source field effect transistor whose gate receives a reference signal and a first feedback field effect transistor whose gate receives the common mode feedback signal, the drains of the first reference source field effect transistor and the first feedback transistor being coupled to a power source and the drains of the first reference source field effect transistor and the first feedback transistor being operatively coupled so as to form the first current, and wherein the second current source is comprised of a second reference source field effect transistor whose gate receives a reference signal and a second feedback field effect transistor whose gate receives the common mode feedback signal, the drains of the second reference source field effect transistor and the second feedback transistor being coupled to a power source and the drains of the second reference source field effect transistor and the second feedback transistor being operatively coupled so as to form the second current;

further comprising a third switched signal path and a fourth switched signal path, the third switched signal path being coupled to the second current source, and including an up-complement signal controlled switch having active and non-active states, the state of the up-complement signal controlled switch being controlled by an up-complement signal, with the third switched signal path providing a path for a third switched signal, the third switched signal being at least a portion of the second current, when the up-complement signal controlled switch is in the active state, and the fourth switched signal path being coupled to the first current source, and including a down-complement signal controlled switch having active and non-active states, the state of the down-complement signal controlled switch being controlled by a down-complement signal, with the fourth switched signal path providing a path for a fourth switched signal, the fourth switched signal being at least a portion of the first current, when the down-complement signal controlled switch is in the active state.

5. The charge pump including a common mode feedback circuit of claim 4 wherein the common mode circuit comprises a differential transistor pair provided inputs from the first output signal path and the second output signal path, a reference differential pair provided inputs from a reference source, and a current mirror coupled to the differential transistor pair and the reference differential pair.

6. The charge pump including a common mode feedback circuit of claim 5 wherein the differential transistor pair comprises PMOS transistors, with the gate of one of the PMOS transistors comprising the differential pair provided an input from the first output signal path and the gate of the other one of the PMOS transistors comprising the differential pair provided an input from the second output signal path.

7. The charge pump including a common mode feedback circuit of claim 6 wherein the reference differential pair comprises PMOS transistors, the gate of one of the PMOS transistors comprising the differential pair provided a reference voltage from the reference source, and the gate of the other one of the PMOS transistors comprising the differential pair provided the reference voltage from the reference source.

8. The charge pump including a common mode feedback circuit of claim 7 wherein the drains of the PMOS transistors comprising the reference pair are maintained at least at a threshold voltage above the reference voltage.

9. The charge pump including a common mode feedback circuit of claim 8 wherein the drains of the PMOS transistors comprising the differential pair are maintained at least at the threshold voltage above the reference voltage.

10. A differential charge pump utilizing a common mode feedback circuit comprising:
    first means for receiving an up signal;
    second means for receiving a down signal;
    third means coupled to said first means for generating a first source signal comprised of means of generating two first source currents;
    fourth means coupled to said second means for generating a second source signal comprised of means of generating two second source currents;
    fifth means coupled to said third means and said fourth means for generating a differential output signal, using the first source signal, the second source signal, the up signal, and the down signal;
    sixth means for comparing a common mode component of the differential output signal with a reference to form a feedback signal; and
    seventh means for controlling the third means for generating the first source signal and the fourth means for generating the second source signal, the seventh means for controlling including a reference signal and controlling a first current of the two first source currents and a first current of the two second source currents, and the feedback signal controlling a second current of the two first source currents and a second current of the two second source currents.

11. The differential charge pump utilizing a common mode feedback circuit of claim 10 wherein the first source signal is a first current and the second source signal is a second current.

12. The differential charge pump utilizing a common mode feedback circuit of claim 11 wherein the first current and the second current have the same magnitude.

13. The differential charge pump utilizing a common mode feedback circuit of claim 12 wherein the means for generating a differential output signal includes a first current sink and a second current sink, the first current sink being controlled by the up signal and sinking a portion of the first current when the up signal is high, the second current sink being controlled by the down signal and sinking a portion of the second current when the up signal is high, with a remainder portion of the first current not sunk by the first current sink forming one part of the differential output signal and a remainder portion of the second current not sunk by the second current sink forming another part of the differential output signal.

14. The differential charge pump utilizing a common mode feedback circuit of claim 13 wherein the common mode component of the differential output signal is a common mode voltage of the differential output signal.

15. The differential charge pump utilizing a common mode feedback circuit of claim 14 wherein the means for comparing a common mode component of the differential output signal with a reference to form a feedback signal comprises a reference differential pair generating a reference current based on a reference voltage, an output differential pair generating an output current based on the differential output signal voltage, and a current mirror controlled by the output of the reference differential pair, the current mirror receiving current from the output differential pair.

16. A charge pump comprising:
    a first circuit comprising:
        an up switch responsive to an up input to generate an up output signal, the up switch having a plurality of states, the state of the up switch being determined by the up input;

an up signal source operatively coupled to the up switch, the up signal source generating an up source signal formed by combining a first up signal source signal controlled by a reference signal and a second up signal source signal controlled by a common mode feedback signal; and a magnitude of said up output signal is dependent on the state of the up switch and the up source signal;

a second circuit comprising:

a down switch responsive to a down input to generate a down output signal, the down switch hating a plurality of states, the state of the down switch being determined by the down input;

a down signal source operatively coupled to the down switch, the down signal source generating a down source signal formed by combining a first down signal source controlled by the reference signal and a second down signal source controlled by the common mode feedback signal; and a magnitude of said down output signal is dependent on the state of the down switch and the down source signal;

the up output signal and the down output signal together forming a differential output signal; and a common mode feedback means coupled to said differential output signal for determining a common mode of the differential output signal and for providing the common mode feedback signal to the up signal source and to the down signal source.

* * * * *